(12) United States Patent
Li (10) Patent No.: US 9,059,210 B2
(45) Date of Patent: Jun. 16, 2015

(54) ENHANCED STRESS MEMORIZATION TECHNIQUE FOR METAL GATE TRANSISTORS

(71) Applicants: Semiconductor Manufacturing International (Beijing) Corporation, Beijing (CN); Semiconductor Manufacturing International (Shanghai) Corporation, Shanghai (CN)

(72) Inventor: Yong Li, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/227,986

(22) Filed: Mar. 27, 2014

(65) Prior Publication Data

US 2015/0093871 A1    Apr. 2, 2015

(51) Int. Cl.
*H01L 29/66* (2006.01)
*H01L 29/417* (2006.01)
*H01L 29/51* (2006.01)
*H01L 29/10* (2006.01)
*H01L 29/423* (2006.01)

(52) U.S. Cl.
CPC .... *H01L 29/66545* (2013.01); *H01L 29/41725* (2013.01); *H01L 29/51* (2013.01); *H01L 29/1033* (2013.01); *H01L 29/4232* (2013.01); *H01L 29/42372* (2013.01); *H01L 29/66492* (2013.01); *H01L 29/6653* (2013.01)

(58) Field of Classification Search
None
See application file for complete search history.

(56) References Cited

U.S. PATENT DOCUMENTS

| | | | | |
|---|---|---|---|---|
| 6,787,827 | B2 * | 9/2004 | Inumiya et al. | 257/288 |
| 7,126,199 | B2 * | 10/2006 | Doczy et al. | 257/412 |
| 7,682,917 | B2 * | 3/2010 | Bedell et al. | 438/304 |
| 8,497,197 | B2 * | 7/2013 | Zhu et al. | 438/585 |
| 8,664,054 | B2 * | 3/2014 | Zhu et al. | 438/197 |
| 8,772,095 | B2 * | 7/2014 | Kim et al. | 438/166 |
| 8,802,523 | B2 * | 8/2014 | Hong | 438/199 |
| 8,936,988 | B2 * | 1/2015 | Yin et al. | 438/300 |
| 2006/0046399 | A1 * | 3/2006 | Lindert et al. | 438/282 |
| 2006/0094193 | A1 * | 5/2006 | Horstmann et al. | 438/299 |
| 2006/0099745 | A1 * | 5/2006 | Hsu et al. | 438/149 |
| 2007/0111416 | A1 * | 5/2007 | Huang et al. | 438/197 |
| 2008/0191284 | A1 * | 8/2008 | Baiocco et al. | 257/369 |
| 2008/0237709 | A1 * | 10/2008 | Chidambarrao et al. | 257/347 |
| 2008/0286916 | A1 * | 11/2008 | Luo et al. | 438/197 |
| 2009/0294866 | A1 * | 12/2009 | Eller et al. | 257/369 |
| 2010/0230765 | A1 * | 9/2010 | Quek et al. | 257/408 |

(Continued)

*Primary Examiner* — Andres Munoz
(74) *Attorney, Agent, or Firm* — Kilpatrick Townsend and Stockton LLP (57) ABSTRACT

A method of manufacturing a semiconductor device includes forming a dummy gate structure on a semiconductor substrate, forming sidewall spacers, and forming heavily doped source/drain regions. After removing the spacers, a stress material layer is formed over the dummy gate structure. An annealing process is performed to transfer the stress to the device channel region. After the annealing process, the stress material layer is removed. The dummy gate structure is replaced by a high-k dielectric layer and a metal gate structure. Subsequently, contact holes are formed to expose at least part of the heavily doped source/drain regions, and self-aligned silicide is formed over exposed portions of the heavily doped source/drain regions.

20 Claims, 6 Drawing Sheets

(56) References Cited

U.S. PATENT DOCUMENTS

| | | | |
|---|---|---|---|
| 2011/0006373 A1* | 1/2011 | Eller et al. | 257/369 |
| 2011/0104864 A1* | 5/2011 | Jeng et al. | 438/305 |
| 2012/0083106 A1* | 4/2012 | Zhu | 438/585 |
| 2012/0214295 A1* | 8/2012 | Liu | 438/585 |
| 2012/0252198 A1* | 10/2012 | Zhu et al. | 438/585 |
| 2012/0264262 A1* | 10/2012 | Zhu et al. | 438/197 |
| 2013/0273706 A1* | 10/2013 | Hung et al. | 438/303 |
| 2013/0316506 A1* | 11/2013 | Chang et al. | 438/285 |
| 2014/0256109 A1* | 9/2014 | Yin et al. | 438/300 |

* cited by examiner

ENHANCED STRESS MEMORIZATION TECHNIQUE FOR METAL GATE TRANSISTORS

CROSS-REFERENCES TO RELATED APPLICATIONS

This application claims priority to Chinese Patent Application No. 201310459968.6, filed Sep. 27, 2013 commonly assigned, incorporated by reference herein for all purposes.

BACKGROUND OF THE INVENTION

Embodiments of the present invention relate generally to a semiconductor manufacturing process. More particularly, embodiments of the present invention provide a method to realize stress memorization techniques (SMT) for a high-k metal-gate process to improve transistor performance.

In advanced semiconductor manufacturing processes, stress memorization technique (SMT) is a method often used to improve the performance of N-type field effect transistor (NFET). In conventional SMT techniques, re-crystallization of the polysilicon gate is used to improve the performance of the NFET. When source/drain region ion implantation is performed, inactive dopants are injected into source/drain regions, and the polysilicon gate becomes amorphous. A stress memory material is formed covering the polysilicon gate. After annealing, source/drain regions are activated and, at the same time, the polysilicon gate is re-crystallized. During the re-crystallization process, due to the resistance of the stress memory material layer, the volume expansion of the polysilicon gate electrode is suppressed. As a result, a tensile stress is transferred to the channel region of the semiconductor substrate to improve the carrier mobility.

In conventional SMT techniques, after the stress transfer process, the stress memory material is removed. Then, self-aligned silicide is formed on the source/drain regions. At this point, a masking step is often carried out to form a mask to prevent silicide formation on top of the dummy polysilicon gate, which needs to be removed in a subsequent step. The sidewall spacers on both sides of the polysilicon gate electrode are removed. A contact etch stop layer (CESL) and an interlayer dielectric layer are formed over the gate structure, and chemical mechanical polishing is performed to expose the top of the polysilicon gate. After the polysilicon gate electrode is removed, a high-k gate dielectric layer and a metal gate are formed. A second interlayer dielectric layer is formed over the metal gate and the first interlayer dielectric layer. Next, contact plugs are formed to contact the metal gate and the silicide regions on the source/drain regions.

BRIEF SUMMARY OF THE INVENTION

The inventors of this disclosure have identified many limitations to the conventional stress memorization techniques described above. First, during the stress memorization process, the spacers are present on both sides of the polysilicon gate electrode, which increases the distance between the stress memory material layer and the channel region under the gate polysilicon. As a result, during annealing, the transfer of the stress to the channel region is weakened. Second, during the formation of salicide on the source/drain regions, an additional mask is needed in order to avoid forming silicide on the top of the dummy polysilicon gate electrode, resulting in increased process costs.

Embodiments of the present invention provide an improved method to realize stress memorization techniques (SMT) for a high-k metal-gate process to improve transistor performance. In embodiments of the invention, the sidewall spacers are removed before the formation of the stress material layer, leading to more effective transfer of stress to the channel region. Further, the silicide on the source/drain regions are formed after the sacrificial polysilicon gate is removed and the metal gate is formed. This process eliminates the need to remove the silicide on top of the sacrificial polysilicon gate and simplifies the process flow. In addition, the silicide process is moved back in the process flow, reducing the probability of damaging the silicide in other process steps.

According to an embodiment of the present invention, a method of manufacturing a semiconductor device includes forming a dummy gate structure on a semiconductor substrate, the dummy gate structure including a sacrificial gate electrode layer over a sacrificial gate dielectric layer, forming spacers on both sides of the dummy gate structure, and performing ion implantation to form heavily doped source/drain regions in the semiconductor substrate. In some embodiments, a deep pre-amorphization implantation is carried out before forming source/drain regions. During subsequent stress layer formation and anneal, dislocations are formed in the regions receiving pre-amorphization implant, which enables stress generation in the channel region. The pre-amorphization implant can be carried out using group IV ions, such as carbon and germanium. The method includes removing the sidewall spacers, and after removing the sidewall spacers, forming a stress material layer over the dummy gate structure. The method also includes performing an annealing process, and after the annealing process, removing the stress material layer. An interlayer dielectric layer is formed surrounding the dummy gate structure. The dummy gate structure is removed to form a groove in the interlayer dielectric layer. The method includes forming a high-k dielectric layer and a metal gate structure in the groove, forming contact holes that expose at least part of the heavily doped source/drain regions, and forming self-aligned silicide over exposed portions of the heavily doped source/drain regions.

In another embodiment of the above method, the high-k dielectric material layer comprises one or more of hafnium oxide, hafnium silicon oxide, silicon oxynitride, hafnium oxide, lanthanum oxide, zirconium oxide, zirconium silicon oxide, titanium oxide, tantalum oxide, barium strontium titanium oxide, barium titanium oxide, strontium titanium, or alumina.

In another embodiment the sacrificial gate dielectric layer comprises an oxide material, and the sacrificial gate electrode layer comprises polysilicon or amorphous carbon.

In another embodiment, an interface layer is formed below the high-k dielectric layer, the interface layer comprising silicon oxide.

In another embodiment, the method also includes forming a covering layer between the high-k dielectric layer and the metal gate structure, the covering layer comprising titanium nitride or tantalum nitride.

In another embodiment, the method also includes forming an offset spacer between the dummy gate structure and the sidewall spacer. The offset spacer comprises an oxide material, and the sidewall spacer comprises silicon nitride.

In another embodiment, the stress material layer is formed over the offset spacers.

In another embodiment, the method also includes an ion implantation step for forming lightly doped source/drain regions in said semiconductor substrate before forming the sidewall spacers.

In another embodiment, the method also includes a step of pre-amorphization implantation before forming the lightly doped source/drain regions. In an embodiment, the step of pre-amorphization implantation includes implanting group IV ions, such as carbon and germanium.

In another embodiment, the method also includes performing ion implantation to form pocket regions surrounding the low-doped source/drain regions.

In another embodiment, a conformal deposition process is used to form the stress material layer.

In another embodiment, forming the dielectric layer surrounding the dummy gate structure includes forming a contact hole etch stop layer, forming an interlayer dielectric layer, and polishing the interlayer dielectric layer to expose the dummy gate structure.

In another embodiment, a conformal deposition process is used to form the contact hole etch stop layer.

In another embodiment, the contact hole etch stop layer comprises a silicon nitride material, and the interlayer dielectric material comprises a silicon oxide material.

In another embodiment, the dummy gate structure comprises a work function setting metal layer, a barrier material layer, and a metal gate electrode material layer.

In another embodiment, the work function setting metal layer comprises one or more layers of metal or metal compound, and the barrier material layer comprises titanium nitride or tantalum nitride.

In another embodiment, the method also includes, before forming the contact holes, forming a second interlayer dielectric layer overlying the metal gate structure, and planarize the second interlayer dielectric layer.

According to another embodiment of the present invention, a method of manufacturing a semiconductor device includes forming a dummy gate structure on a semiconductor substrate, the dummy gate structure including a sacrificial gate electrode layer over a sacrificial gate dielectric layer, forming offset spacers on both sides of the dummy gate structure, and performing ion implantation to form lightly doped source/drain regions in the semiconductor substrate. The method also includes forming sidewall spacers on both sides of the dummy gate structure, and performing ion implantation to form heavily doped source/drain regions in the semiconductor substrate. The method includes removing the sidewall spacers, and, after removing the sidewall spacers, forming a stress material layer over the dummy gate structure and the offset spacers. The method further includes performing an annealing process, and after the annealing process, removing the stress material layer. The method also includes forming a planarized dielectric layer surrounding the dummy gate structure and exposing a top surface of the dummy gate structure, removing the dummy gate structure to form a groove in the dielectric layer, and forming a high-k dielectric layer and a metal gate structure in the groove. The method also includes forming contact holes that expose at least part of the heavily doped source/drain regions, and forming self-aligned silicide over exposed portions of the heavily doped source/drain regions. In an embodiment, the dummy gate structure includes a work function setting metal layer, a barrier material layer, and a metal gate electrode material layer.

A further understanding of the nature and advantages of the present invention may be obtained by reference to the remaining portions of the specification and the drawings.

DETAILED DESCRIPTION OF THE INVENTION

The description below is presented with reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

FIGS. 1A-1I are cross-sectional views showing steps of a method according to an exemplary embodiment of the present invention.

Figure 1A:
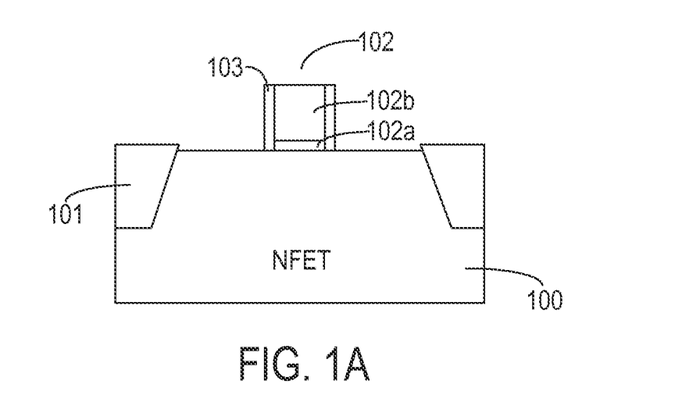
FIGS. 1A-1I are cross-sectional views showing steps of a method according to an exemplary embodiment of the present invention.

First, FIG. 1A shows a semiconductor substrate 100, which may include a semiconductor material such as undoped silicon, doped with impurities of silicon, silicon on insulator (SOI), stacked insulator silicon (SSOI), silicon-germanium-on-insulator laminate (S—SiGeOI), silicon-germanium-on-insulator (SiGeOI) and germanium on insulator (GeOI), and the like. As an example, in the present embodiment, semiconductor substrate 100 is single crystal silicon material. As shown in FIG. 1, isolation structure 101 is formed in semiconductor substrate 100. For example, isolation structure 101 can be a shallow trench isolation (STI) structure or a local oxidation of silicon (LOCOS) isolation structure. In the present embodiment, the shallow trench isolation structure is shown. Isolation structure 101 can be used to separate devices, such as NFET region and PFET region. In order to simplify the description, the illustration only shows an NFET region. In addition, various well structures, such as N-well and P-well can be formed in the semiconductor substrate, but are not shown in order to simplify the illustration.

As shown in FIG. 1A, a dummy gate structure 102 is formed on semiconductor substrate 100. As an example, dummy gate structure 102 includes stacked sacrificial gate dielectric layer 102a and a sacrificial gate electrode layer 102b. The sacrificial gate dielectric material layer 102a is preferably an oxide, such as silica. The material for sacrificial gate electrode layer 102b can include polysilicon or amorphous carbon. Offset spacers 103 are formed on both sides of dummy gate structure 102. Offset spacers 103 can be formed by oxides, nitrides, or a combination of both. In this embodiment, offset spacers 103 is made of oxide. The offset can be formed using a conventional process, such as dielectric layer deposition and anisotropic etching, and will not be described in detail here.

Figure 1B:
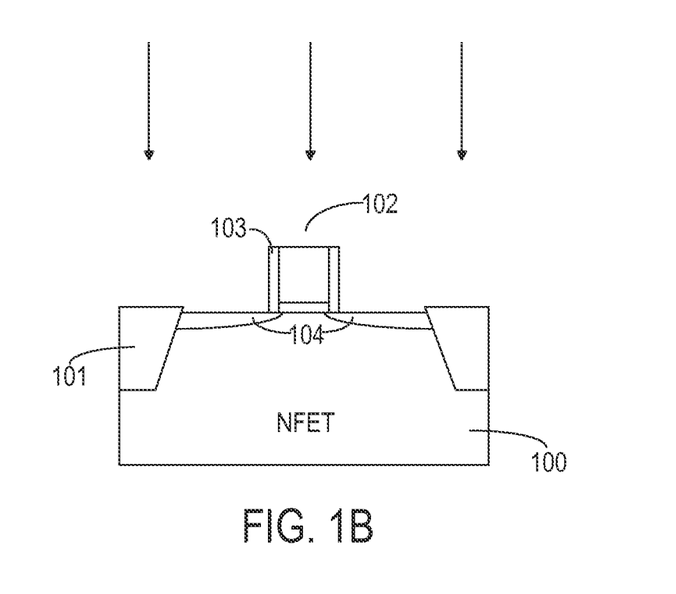

Subsequently, as shown in FIG. 1B, a low ion implantation is carried out to form lightly-doped source/drain regions 104 in the semiconductor substrate 100. For the NFET region, the low dopant ions implanted dopant ions may be phosphorus ions or arsenic ions. In an embodiment, phosphorus ions with ion implantation energy in the range of 1-20 keV and a dose of $1.0 \times e^{14} - 1.0 \times e^{15} cm^{-2}$ can be used. In another embodiment, arsenic ions with ion implantation energy in the range of 2-35 keV and a dose of ion implantation $1.0 \times e^{14} - 1.0 \times e^{15} cm^{-2}$ can be used.

In some embodiments, pre-amorphization implantation (PAI) can be performed before the lightly doped regions are implanted to reduce short channel effects. For example, germanium, carbon, or other group IV family ions can be used.

Next, optionally, pocket region ion implantation can be performed in the semiconductor substrate 100 for adjusting the threshold voltage and preventing punch through of source/drain regions. In order to simplify the illustration, the pocket regions are not shown. The pocket regions are slightly larger than the depth of the lightly-doped source/drain regions and have opposite conductivity type. For the NFET region, boron ions or indium ions can be used for pocket implant. In an embodiment, boron ions of energy in the range of 3-20 keV and a dose of $1.0 \times e^{13}$–$9.0 \times e^{13} cm^{-2}$ are implanted at an angle in the range of 0-45 degrees with respect to the perpendicular direction of the semiconductor substrate. In another embodiment, indium ions of energy in the range of 100-150 keV and a dose of $1.0 \times e^{13}$–$9.0 \times e^{13} cm^{-2}$ are implanted at an angle in the range of 0-45 degrees with respect to the perpendicular direction of the semiconductor substrate.

With a selected implant angle, rotation is performed during the implant, which can reduce shadow effect and form symmetrical distribution of impurities. With properly selected ion implantation energy, dose, and the low angle ion implantation, pocket implant can be used to effectively suppress drain-induced barrier lowering (DIBL) that can cause short channel effect. In an embodiment, rapid thermal annealing process is used to activate the low-doped source/drain region 104 and the pocket regions and to eliminate defects caused by dopant ions during the ion implantation. In other embodiments, other annealing methods may also be used.

In the embodiment described above, the rapid thermal annealing step is carried out after the lightly-doped source/drain ion implantation and the pocket regions ion implantation steps. However, in other embodiments, the rapid thermal annealing step can be carried out twice, i.e. for the first time after the low dopant ion implantation step and a second time after the pocket region ion implantation step. In still other embodiments, in order to reduce the thermal budget, the rapid thermal annealing step can be moved further down the process flow, to the subsequent implementation of stress memorization. In other words, the rapid thermal anneal step can be combined with the anneal step after the stress material is formed, as described below.

Figure 1C:
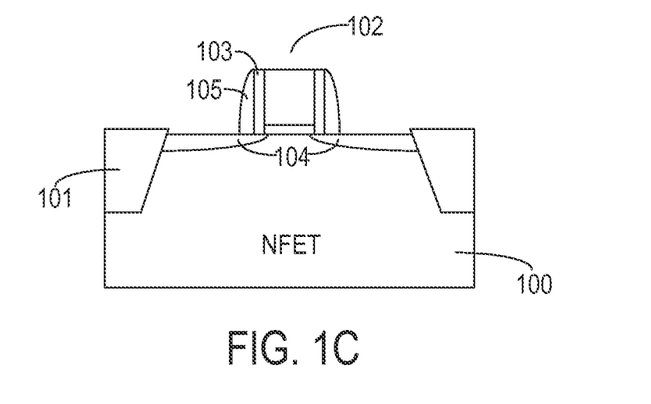

Subsequently, as shown in FIG. 1C, sidewall spacers 105 are formed on both sides of offset spacers 103. The process of forming sidewall spacers 105 can include: covering the dummy or sacrificial gate structure 102 and offset spacers 103 with a silicon nitride material and performing a blanket etching process to form spacers 105. Note that in some embodiments of the invention, etch selectivity between the offset spacers and the sidewall spacers are desirable. Therefore, different materials are used, for example, oxide for offset spacer and nitride for sidewall spacers, or vice versa.

Figure 1D:
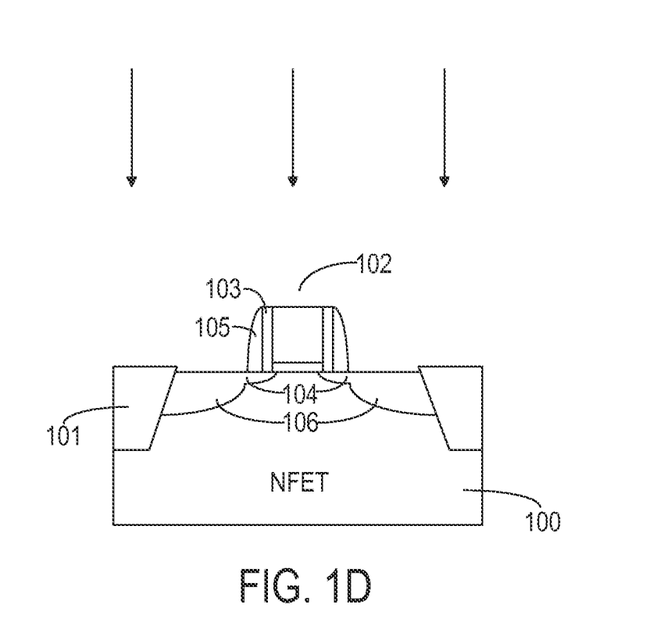

Subsequently, as shown in FIG. 1D, ion implantation and annealing are carried out to form heavily doped source/drain regions 106 in semiconductor substrate 100. Conventional implant and anneal processes can be used and are not repeated here. To reduce the thermal budget, the annealing step can be moved to a subsequent stress memorization step. Further, in some embodiments, pre-amorphization implantation can be used to reduce short channel effects. As described above, pre-implantation can use germanium, carbon, or other group IV family ions, or a combination of these ions.

Figure 1E:
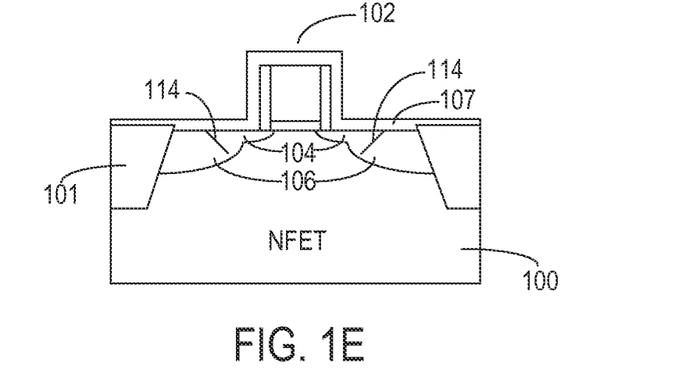

Subsequently, as shown in FIG. 1E, sidewall spacers 105 are removed. Next, a stress material layer 107 is formed on the semiconductor substrate 100 to completely cover dummy gate electrode structure 102 and offset spacers 103. In the present embodiment, the sidewall spacers 105 are removed by wet etching process. A conformal deposition process is used to form stress material layer 107 so that stress material layer 107 has good step coverage characteristics. Before the stress of the material is formed, a thin oxide layer can be formed to prevent damage to the substrate 100 during subsequent removal of the stress layer 107. For simplicity, the thin oxide layer is not shown in the illustration.

Next, a rapid thermal annealing process is performed to transfer the stress in stress material layer 107 to the channel region in semiconductor substrate 100. A possible explanation is that the stress is transferred through dislocation defects in the direction as shown by diagonal lines 114 in FIG. 1E. The dislocation defects can significantly enhance the stress acting on the channel region of the NFET region to further enhance the performance NFET region. For the NFET region, the tensile stress is applied to the channel region to improve carrier mobility in the channel region. In other embodiments, other annealing method may be used to achieve a similar effect.

Figure 1F:
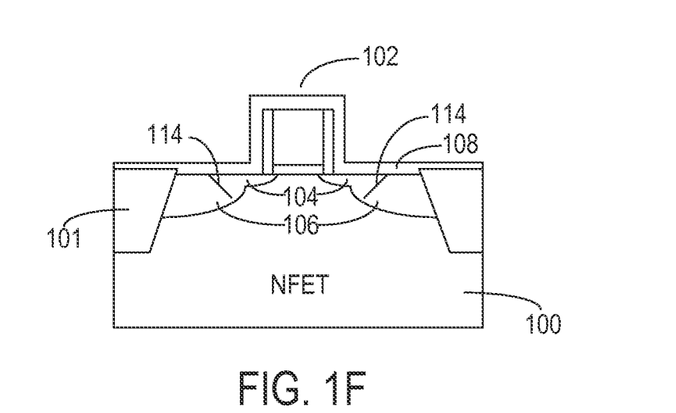

Subsequently, as shown in FIG. 1F, stress material layer 107 is removed. And then a contact hole etch stop layer 108 is formed to cover dummy gate structure 102 and offset spacers 103 on semiconductor substrate 100. In the present embodiment, a wet etching process is used to remove stress material layer 107, and a conformal deposition process is used to form the contact etch stop layer 108, so that the contact etch stop layer 108 has good step coverage characteristics. Contact etch stop layer 108 material is preferably silicon nitride.

Figure 1G:
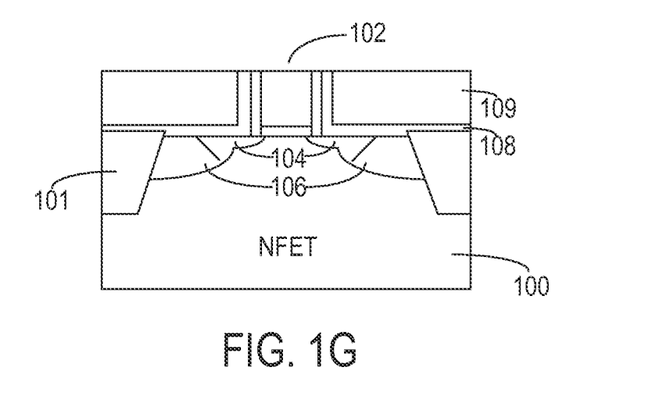

Subsequently, as shown in FIG. 1G, an interlayer dielectric layer 109 is formed on contact hole etch stop layer 108. A chemical mechanical polishing process is to planarize dielectric layer 109 and to remove the contact hole etch stop layer 108 to expose the top of dummy gate structure 102. The forming of interlayer dielectric layer 109 may use a variety of suitable processes familiar to a skilled person, such as a chemical vapor deposition process. In some embodiments, the interlayer material is a silicon oxide dielectric layer.

Figure 1H:
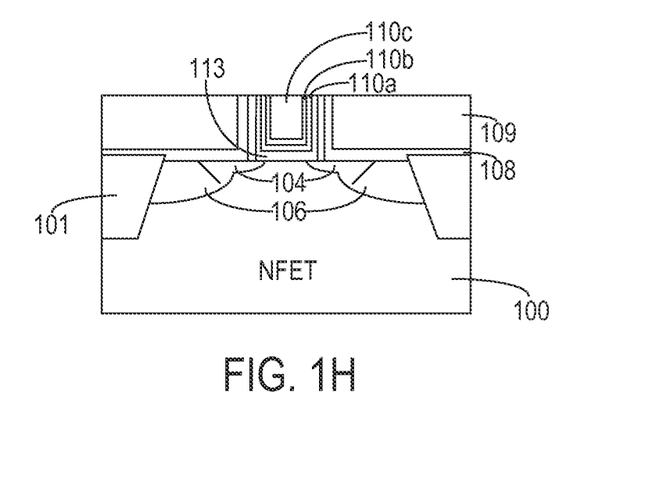

Subsequently, as shown in FIG. 1H, dummy or sacrificial gate structure 102 is removed to form a groove in interlayer dielectric 109. Next, a high-k dielectric layer 113 and a metal gate structure are formed in the grooves. Depending on the embodiments, high-k dielectric material layer 113 can include hafnium oxide, hafnium silicon oxide, silicon oxynitride, hafnium oxide, lanthanum oxide, zirconium oxide, zirconium silicon oxide, titanium oxide, tantalum oxide, barium strontium titanium oxide, barium titanium oxide, strontium titanium oxide, alumina, and the like, or a combination of one or more of the above materials. In some embodiments, hafnium oxide, zirconium oxide, or aluminum oxide can be used. In some embodiments, under high-k dielectric layer 113, an interfacial layer may be formed, which can include a silicon oxide material comprises SiOx. The role of the interface layer is to improve properties of the interface between the high-k dielectric layer 113 of the semiconductor substrate 100. Further, a covering layer can be formed between the metal gate structure and the high-k dielectric layer to prevent metal diffusion into the high-k dielectric layer. The covering layer can include titanium nitride or tantalum nitride. Conventional deposition methods can be used to form these layers.

As shown in FIG. 1H, the metal gate structure includes a work function setting layer 110a, a barrier layer 110b, and a metal gate material 110c. Work function setting layer 110a can include one or more layers of metal or metal compound. For the N-type FET metal gate structure, the work function setting material can include metallic materials such as titanium, tantalum, aluminum, zirconium, hafnium, and alloys thereof. It can also include a carbide or a nitride of the metal elements listed above. The barrier material layer 110b can include titanium nitride or tantalum nitride. The metal gate material layer 110c material can include tungsten or aluminum. In the present embodiment, a dry etching or wet etching process can be used to remove the dummy gate structure 102. Worked function setting layer 110a and barrier layer 110b can be formed using an atomic layer deposition process or a physical vapor deposition process. Metal gate electrode material layer 110c can be formed using a chemical vapor deposition process or physical vapor deposition process. Then, a chemical mechanical polishing process is carried out to polish the layers described above until dielectric layer 109 is exposed.

Figure 1I:
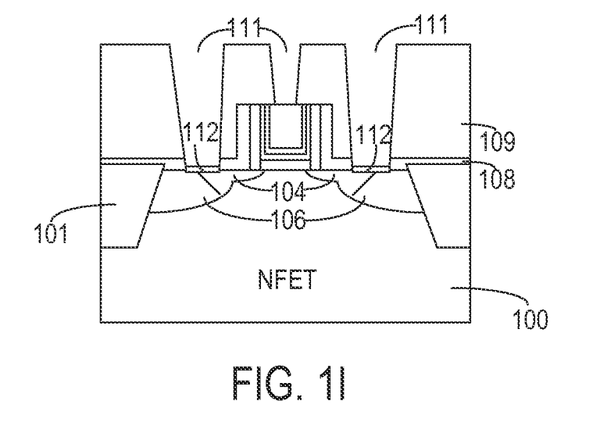

Subsequently, as shown in FIG. 1I, a second interlayer dielectric layer 109 is formed again to cover the metal gate structure, and then planarized by chemical mechanical polishing. In other embodiments, the second interlayer dielectric layer may be formed by a different material than the first interlayer dielectric layer.

Next, contact holes 111 are formed using the following process. First, an amorphous carbon layer, e.g., Advanced Patterning Film -APF, a dielectric antireflection layer (DARC), and a photoresist layer are formed on the interlayer dielectric layer 109. The photoresist layer is patterned. Then, using the photoresist layer as a mask, contact holes 111 are etched using a dry etch process in dielectric layer 109. The etch process terminates when the contact hole etch stop layer 108 is reaches. An ashing process is used to remove the photoresist layer. Subsequently, another dry etching process is performed to remove the exposed etch stop layer 108. Next, the amorphous carbon layer and the antireflective dielectric layers are removed. In some embodiments, self-aligned silicide 112 is formed through contact holes 111 on the exposing the heavily doped source/drain regions 106. A conventional self-aligned silicide process can be used to form the salicide. In some embodiments, the silicide forming process includes deposition of a metal layer, e.g., tungsten, titanium, or nickel, etc. A rapid thermal anneal process is carried out to form silicide when the metal layer is in contact with an exposed silicon surface. Then, unreacted portion of the metal layer is etched off. As shown in FIG. 1I, the silicide is formed over the exposed silicon surface in the source/drain regions, and no silicide is formed over the metal gate structure.

This completes the process steps of the method according to an exemplary embodiment of the present invention. The semiconductor device can be completed by subsequent production processes, for example, a metal (usually tungsten) is formed in the contact hole 111 to form contact plugs connecting the silicide to an interconnection the metal layer; forming a plurality of interconnect metal layers, usually accomplished using dual damascene process; and forming a metal pads for wire bonding for device package.

Figure 2:
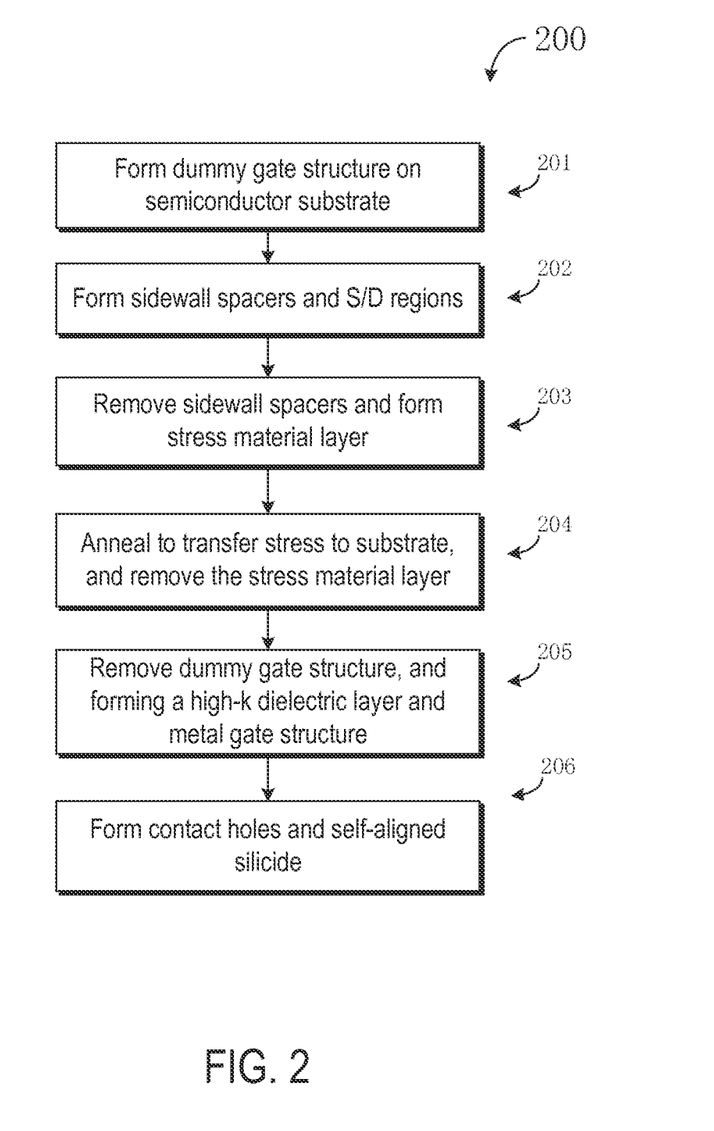
FIG. 2 is a flowchart of a method according to an exemplary embodiment of the present invention, wherein the steps are sequentially performed.

FIG. 2 is a flowchart of a method according to an exemplary embodiment of the present invention, wherein the steps are sequentially performed.

In step 201, form a sacrificial or dummy gate structure on a semiconductor substrate. The sacrificial or dummy gate structure includes a sacrificial gate electrode layer on a sacrificial gate dielectric layer on the semiconductor substrate.

In step 202, form sidewall spacers on both sides of the dummy gate structure, and perform ion implantation to form a heavily doped source/drain (S/D) regions in the semiconductor substrate.

In step 203, remove the sidewall spacers, and form a stress material layer overlying the sacrificial gate structure.

In step 204, anneal to transfer stress to substrate, and remove the stress material layer;

In step 205, remove sacrificial gate structure, and forming a high-k dielectric layer and metal gate structure.

In step 206, form contact holes, and form a self-aligned silicide over the heavily doped source/drain regions exposed by the contact holes.

According to embodiments of the present invention, the stress memorization process, in which the stress is transferred from the stress material layer to the device channel region, is performed after removing the sidewall spacers on the sides of sacrificial gate structure 102. A more effective stress transfer process can be realized. In some embodiments, the self-aligned silicide (salicide) is formed after the metal gate structure is formed to simply the process flow and to avoid damage to the self-aligned silicide in conventional processes.

The present invention has been described by the above embodiments. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of manufacturing a semiconductor device, comprising:
    forming a dummy gate structure on a semiconductor substrate, the dummy gate structure including a sacrificial gate electrode layer over a sacrificial gate dielectric layer;
    forming sidewall spacers on both sides of the dummy gate structure;
    performing a deep pre-amorphization implant;
    performing an ion implantation to form heavily doped source/drain regions in the semiconductor substrate;
    removing the sidewall spacers;
    after removing the sidewall spacers, forming a stress material layer over the dummy gate structure;
    performing an annealing process;
    after the annealing process, removing the stress material layer;
    forming an interlayer dielectric layer surrounding the dummy gate structure;
    removing the dummy gate structure to form a groove in the interlayer dielectric layer;
    forming a high-k dielectric layer and a metal gate structure in the groove;
    forming contact holes that expose at least part of the heavily doped source/drain regions; and
    forming a self-aligned silicide over exposed portions of the heavily doped source/drain regions.

2. The method of claim 1, wherein the high-k dielectric layer comprises one or more of hafnium oxide, hafnium silicon oxide, silicon oxynitride, hafnium oxide, lanthanum oxide, zirconium oxide, zirconium silicon oxide, titanium oxide, tantalum oxide, barium strontium titanium oxide, barium titanium oxide, strontium titanium, or alumina.

3. The method of claim 1, wherein the sacrificial gate dielectric layer comprises an oxide material, and the sacrificial gate electrode layer comprises polysilicon or amorphous carbon.

4. The method of claim 1, wherein an interface layer is formed below the high-k dielectric layer, the interface layer comprising silicon oxide.

5. The method of claim 1, further comprising forming a covering layer between the high-k dielectric layer and the metal gate structure, the covering layer comprising titanium nitride or tantalum nitride.

6. The method of claim 1, further comprising forming offset spacers between the dummy gate structure and the sidewall spacers, wherein the offset spacers comprise an oxide material and the sidewall spacers comprise silicon nitride.

7. The method of claim 6, wherein the stress material layer is formed over the offset spacers.

8. The method of claim 6, further comprising an ion implantation step for forming lightly doped source/drain regions in said semiconductor substrate before forming the sidewall spacers.

9. The method of claim 8, wherein the pre-amorphization implant is carried out before forming the lightly doped source/drain regions.

10. The method of claim 9, wherein the pre-amorphization implant includes implanting group IV ions.

11. The method of claim 8, further comprising performing an ion implantation to form pocket regions surrounding the lightly doped source/drain regions.

12. The method of claim 1, wherein a conformal deposition process is used to form the stress material layer.

13. The method of claim 1, wherein forming the interlayer dielectric layer surrounding the dummy gate structure comprises:
  forming a contact hole etch stop layer;
  forming the interlayer dielectric layer; and
  polishing the interlayer dielectric layer to expose the dummy gate structure.

14. The method of claim 13, wherein the contact hole etch stop layer comprises a silicon nitride material, and the interlayer dielectric material comprises a silicon oxide material.

15. The method of claim 1, wherein the metal gate structure comprises a work function setting metal layer, a barrier material layer, and a metal gate electrode material layer.

16. The method of claim 15, wherein the work function setting metal layer comprises one or more layers of metal or metal compound, and the barrier material layer comprises titanium nitride or tantalum nitride.

17. The method of claim 1, further comprising, before forming the contact holes, forming a second interlayer dielectric layer overlying the metal gate structure, and planarizing the second interlayer dielectric layer.

18. A method of manufacturing a semiconductor device, comprising:
  forming a dummy gate structure on a semiconductor substrate, the dummy gate structure including a sacrificial gate electrode layer over a sacrificial gate dielectric layer;
  forming offset spacers on both sides of the dummy gate structure, and performing an ion implantation to form lightly doped source/drain regions in the semiconductor substrate;
  forming sidewall spacers on both sides of the dummy gate structure, and performing an ion implantation to form heavily doped source/drain regions in the semiconductor substrate;
  removing the sidewall spacers;
  after removing the sidewall spacers, forming a stress material layer over the dummy gate structure and the offset spacers;
  performing an annealing process;
  after the annealing process, removing the stress material layer;
  forming a planarized dielectric layer surrounding the dummy gate structure and exposing a top surface of the dummy gate structure;
  removing the dummy gate structure to form a groove in the planarized dielectric layer;
  forming a high-k dielectric layer and a metal gate structure in the groove;
  forming contact holes that expose at least part of the heavily doped source/drain regions; and
  forming a self-aligned silicide over exposed portions of the heavily doped source/drain regions.

19. The method of claim 18, wherein the metal gate structure comprises a work function setting metal layer, a barrier material layer, and a metal gate electrode material layer.

20. The method of claim 18, further comprising, before forming the contact holes, forming a second interlayer dielectric layer overlying the metal gate structure, and planarizing the second interlayer dielectric layer.

* * * * *